(12) United States Patent
Hasegawa et al.

(10) Patent No.: US 6,717,043 B2
(45) Date of Patent: Apr. 6, 2004

(54) THERMOELECTRIC POWER GENERATOR

(75) Inventors: Niichiro Hasegawa, 10-24, Gochi, 3-chome, Jyoetsu-shi, Niigata (JP), 942-0081; Mutsuko Hasegawa, Niigata (JP)

(73) Assignees: Shin-Etsu Chemical Co., Ltd., Tokyo (JP); Niichiro Hasegawa, Niigata (JP)

( * ) Notice: Subject to any disclaimer, the term of this patent is extended or adjusted under 35 U.S.C. 154(b) by 89 days.

(21) Appl. No.: 09/979,708

(22) PCT Filed: Mar. 22, 2001

(86) PCT No.: PCT/JP01/02294

§ 371 (c)(1),
(2), (4) Date: Mar. 1, 2002

(87) PCT Pub. No.: WO01/71821

PCT Pub. Date: Sep. 27, 2001

(65) Prior Publication Data

US 2002/0180042 A1 Dec. 5, 2002

(30) Foreign Application Priority Data

Mar. 24, 2000 (JP) .................................. PCT/JP00/01825

(51) Int. Cl.$^7$ .......................... H01L 35/30; H01L 35/12
(52) U.S. Cl. ................ 136/205; 136/236.1; 257/930
(58) Field of Search ................ 136/200, 201, 136/205, 203, 236.1; 257/930

(56) References Cited

FOREIGN PATENT DOCUMENTS

| JP | 56-106378 | * | 8/1981 |
| JP | 4-039874 | * | 10/1992 |
| JP | 6-151978 | * | 5/1994 |
| JP | 8-306964 | * | 11/1996 |

* cited by examiner

Primary Examiner—Patrick Ryan
Assistant Examiner—Thomas H. Parsons
(74) Attorney, Agent, or Firm—Crowell & Moring LLP

(57) ABSTRACT

A thermoelectric power generator is provided capable of generating electric power from solar heat, geothermal heat or exhaust heat of low or medium temperature. The thermoelectric power generator operates via a working mechanism where a slightly hydrated sulfide semiconductor layer, having one side in contact with a low Fermi level redox reaction and having the other side in contact with a high Fermi level reaction generated by reactive metal cathode, allows electron transfer from the redox reaction into the cathode. This is accomplished by a thermal excitation step between both energy bands followed by a charge separation step driven by the internal electric field. The difference between the Fermi levels of the energy bands results in a useful electromotive ability.

11 Claims, 5 Drawing Sheets

THERMOELECTRIC POWER GENERATOR

BACKGROUND OF THE INVENTION

1. Field of the Invention

The present invention relates to a thermoelectric power generator and more particularly to a thermoelectric power generator capable of generating power not only from solar heat and geothermal heat but also from a heat source of medium or low temperature which has been impossible to be utilized by conventional arts, with high efficiency of thermoelectric conversion.

2. Description of the Related Art

At the present time, heat energy is converted into electric power mainly by a heat engine in which the process is: heat energy→high pressure steam→turbine→generator→electric power.

This method of converting heat energy into electric power have greatly contributed as power sources for supporting people's life in society, but there is a problem that it accompanies a large waste heat with its thermal efficiency of 45% at the best.

To combine a gas turbine to this method has already been attempted to good purpose, and it is applicable to thermal power generation using fossil fuels but not applicable to nuclear power generation.

Power generation by fuel cells seems like a promising one from a point of view of largely improving thermal efficiency, however at present the usable fuel is limited to hydrogen which is comparatively expensive and there still remain problems.

On the other hand, the conversion of heat energy into electric power using devices based on Seebeck effect is already established, but its thermal efficiency is 20% at the best and not in the state of general use on a large scale.

Electric power will continue without doubt to be necessary as an important energy to support people's life in society in the future. A requisite for the process of obtaining electric power from heat energy is to attain thermal efficiency as high as possible now that global environment crisis is strongly acknowledged.

However, there is a theoretical upper limit which can not be exceeded in thermal efficiency of each process of converting heat energy into electric power, and in any of the processes its thermal efficiency has reached near the upper limit by continued effort. Therefore, a leap in the concept of the method of thermoelectric conversion itself is necessary to get a quantum leap in thermal efficiency.

The inventors have investigated the operating mechanism of already-existing solar cells and devices utilizing Seebeck effect and worked toward development of a thermoelectric conversion device which operates at room temperature and moreover without large temperature difference in the device.

Two inventions made heretofore were applied for patent; the first one is disclosed Japanese Unexamined Patent Publication 6-151978 and the second is disclosed Japanese Unexamined Patent Publication 8-306964.

SUMMARY OF THE INVENTION

Here, the idea and invention obtained through a series of studies made previously will be described, in which mention will also be made of the significance of the present invention.

The basic configuration of the thermoelectric power generator according to the present invention is as follows:

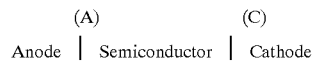

Basic operation is as follows:
1) Electrons are thermally excited from valence band to conduction band in the semiconductor.
2) When an appropriate electric field exists in the semiconductor, the thermally excited electrons gather in region (C) of conduction band while holes gather in the region (A) of valence band. This is charge separation by the built-in electric field.
3) However, in the state cited above, the electrons and holes are in the state of thermal equilibrium, therefore the Fermi level is the same between region (A) and region (C).
4) If the electrons gathering in region (C) of conduction band can rise to higher Fermi level than that in region (A), then the electrons obtain the capability of flowing in an external circuit from cathode to anode and working electrically at the load.

Thus, the heat for thermal excitation of electron from valence band to conduction band in the semiconductor is converted into electric power. A temperature difference between both electrodes is not necessary, which is different from the case of Seebeck effect. Therefore, as the heat energy flowed into the body does not flow out to anywhere but converted into electric power, thermal efficiency would be 100%. This is the idea of thermoelectric conversion that occurred to the inventors. The inventors have made repeated studies to realize the idea, and made several key inventions cited below.

The band gap of semiconductor is desirable to be equal or under 1 eV in order to induce the thermal excitation of electrons in between the energy bands at room temperature or a little higher temperature, which is well known. The condition for building in an appropriate internal electric field to separate the carriers excited in on the energy bands is also publicly known. That is, in the configuration of an device shown below,

the condition for building in appropriate internal electric field to gather holes to region (A) of valence band and electrons to region (C) of conduction band is:

with n-type semiconductor;

$$\Delta\phi_A = \phi_{AN} - \phi_n > (Eg - 0.2)/q \quad [1]$$

$$\Delta\phi_C = \phi_n - \phi_{CA} > 0 \quad [2]$$

with p-type semiconductor;

$$\Delta\phi_A = \phi_{AN} - \phi_p > 0 \quad [3]$$

$$\Delta\phi_C = \phi_p - \phi_{CA} > (Eg - 0.2)/q \quad [4]$$

where symbols denote
  φ work function (v)
  Eg band gap (eV)
  q charge of an electron
  A position (A)
  C position (C)
  n n-type semiconductor p p-type semiconductor
AN anode
CA cathode.

The present invention establishes a Fermi level difference between region (A) and (C) by increasing the minority carrier density in either plane of a semiconductor beyond the thermal equilibrium state by external action.

The configuration of a device the inventors proposed as a means for realizing the idea mentioned above is that, tellurium (Te) is used as a semiconductor, copper (Cu) as an anode, aluminum (Al) as a cathode, The anode and cathode each is brought into close contact with the solid tellurium, and further glycerol is contacted to the cathode side. Properties of matter are as follows:

| Te: | type of conduction ; p-type | |
|---|---|---|
|  | Eg | ; 0.32 eV |
| $\psi$: | Cu | ; 4.86 V |
|  | Te | ; 4.70 V |
|  | Al | ; 4.25 V. |

These values of properties suffice the required conditions [3] and [4]. Further, electrons liberated by the reaction of Al with glycerol are injected into tellurium (Te) at the cathode.

According to the idea of the inventors, the electron, which is minority carrier in tellurium (Te), externally injected with high electrochemical potential exceed the equilibrium state in both energy level and density, and would raise the Fermi level in region (C). The idea was verified by the experiments and the inventors disclosed it in Japanese Unexamined Patent Publication 6-151978. Though the invention enabled the device for thermoelectric conversion, further increase of power output was required.

Further, crystalline semiconductor such as tellurium is not suitable for producing a sheet-like semiconductor of large area. Producing a semiconductor in a sheet of large area is necessary for mass production of thermoelectric power generator, and a semiconductor suitable for this purpose should be selected.

The inventors hit upon an idea of using sulfide semiconductor. This is based on the characteristic that sulfide semiconductor is of ionic bonding and is functioning well by a comparatively easy production method. An idea of producing a sheet of large area is that the fine particles of sulfide semiconductor obtained by liquid phase reaction at normal temperature are shaped into a solid matter and hardened using an appropriate supporting material and binder.

It is necessary that the sulfide semiconductor is in a state of low hydration, and the fact that it contains water achieves an important role as mentioned later. The electron affinity x of sulfide semiconductor was assumed to be 3.6~3.8 V, and further the following materials and the like which were semiconductors having band gap Eg of equal or smaller than 1 eV we re selected as constituent of the device:

$Cu_2S$(p-type, assumed Eg=0.6eV)

FeS(n-type, assumed Eg=0.7eV)

The power output of the device mentioned before using tellurium as semiconductor is small because of small difference of Fermi level between region (A) and (C).

Thus, an idea occurred to th e inventors was: electrochemical reaction having low Fermi level is allowed to exist steadily in region (A); on the other hand electrochemical reaction having high Fermi level is allowed to exist steadily in region (C); the difference of both Fermi levels is applied to the semiconductor as minus bias voltage; and a large difference in Fermi level is established between region (A) and (C).

Here exist two preconditions. The first is that the reaction potential generated in region (A) and that generated in region (C) should be linked. To realize the linkage, the semiconductor layer existing between region (A) and (C) is required to be in the state of a salt bridge. A semiconductor in the hydrated state is necessary for salt bridge formation and is attained only by the method, as mentioned above, in which fine particles of semiconductor are formed to a solid body while containing water. A crystalline semiconductor can not meet this requirement.

The second is that excessive diode current should not flow in the state when the minus bias is applied. This is attained by allowing sufficiently high schottkey barrier to exist in region (A), or allowing potential barrier due to p-n junction to exist in the central region between region (A) and (C).

In the thermoelectric power generator prepared by this invention, the potential barrier existing internally for separating the thermally exited carriers in between energy bands contributes advantageously to restrain the diode current.

The inventors began by selecting a redox reaction system composed of an aqueous solution of $\{Cu^+(NH_3)_2 \sim Cu^{2+}(NH_3)_{2+n}(n=0, 1, 2)\}$.

The reaction potential of this reaction group exists in the favorable region as follows:

$E^0$=0.06V vs NHE (Normal hydrogen electrode) (where n=2)

$\psi_A$=−4.49V vs Vacuum

Further, the reaction system has charge transport ability as a characteristic of redox reaction, which is also a preferable feature.

Then, the inventors thought of allowing the reaction between $S^{2-}$ constituting semiconductor and metal cathode having reaction affinity with $S^{2-}$ to exist in the region (C) in equilibrium state.

Cathode material+$S^{2-}$Sulfide+2e$^-$

In the above reaction equation, rightward progress consuming cathode material and $S^{2-}$ should be suppressed.

This is realized by eliminating strange electrophilic centers which force rightward progress via irreversible consumption of electrons liberated in the reaction. A redox reaction comprising an electrophilic center does not consume electrons irreversibly so long as both reactions, reduction and oxidation are in dynamically balanced state.

The reaction potential difference obtained by linking electrochemical reaction in region (A) and that in region (C) is sufficiently large as shown in Table 1.

TABLE 1

| Cathode material | $E^0$(V vs NHE) | $\psi_C$ (V vs Vac.) | $\Delta\psi = \psi_C - \psi_A$ (V) |
|---|---|---|---|
| Cu | −0.89 | −3.54 | 0.95 |
| Fe | −0.965 | −3.47 | 1.02 |

To provide a redox reaction system to an anode side is well known in the art of wet-type solar cell. However, the finding that a Fermi level difference can be established by allowing reaction potential of electrochemical reaction to exist at both the anode side and the cathode side and by allowing the difference between both reaction potentials to impress on a semiconductor layer as a minus bias voltage is a new discovery obtained by the inventors, by which the possibility of utilizing the thermal excitation phenomenon for a thermoelectric conversion was opened. The inventors have applied for patent with a series of the inventions mentioned above as disclosed in Japanese Unexamined Patent Publication 8-306964.

However, there remained a problem that the corrosion of cathode material should be suppressed in the method according to Japanese Unexamined Patent Publication 8-306964. The corrosion is caused by the fact that the redox reaction liquid existing in the anode region osmoses gradually into the semiconductor layer and intrudes into the cathode region where it reacts with the cathode material. As a natural result, the damage of cathode deteriorates the durability of the device.

To cope with this problem, the inventors tried at first to lower the liquid permeability of the semiconductor layer as low as possible but did not succeed in achieving at the same time two mutually contradictory requirement, i.e. to link the reaction potentials generated at both planes of the semiconductor layer and to decrease the liquid permeability of the layer.

As a next approach, the inventors hit upon an idea in that the aqueous solution of $\{Cu^+(NH_3)_2 \sim Cu^{2+}(NH_3)_{2+n}(n=0, 1, 2)\}$ is occluded in a suitable adsorbent, a necessary amount of binder is added, and further a sufficient amount of ammonium salt is added for the reason mentioned later to solidify and harden the reaction liquid for depriving it of fluidity in order that no reaction liquid may intrude into the cathode range.

The inventors found that active carbon showed a superior performance among a variety of existent adsorbents and succeeded in solidifying redox reaction liquid.

Further, the electrolyte aqueous solution room was eliminated from the cathode region in correspondence with the solidification of the anode reaction liquid, because if electrolyte aqueous solution remains in the cathode region the liquid intrudes into the anode region to allow the elution of the redox reaction system solidified resulting in the loss of effect of the solidification.

The inventors thus succeeded in generating large continuous power output by the thermoelectric power generator in which a solidified redox reaction system is provided in the region of an anode and further the region of a cathode is reduced to the semi-dried state where the cathode contacts a semiconductor. Moreover, this solid state construction is simple, free from trouble such as leakage of liquid, and suitable for commercialization. The invention cited above is the skeleton of the present application.

Figure 1:
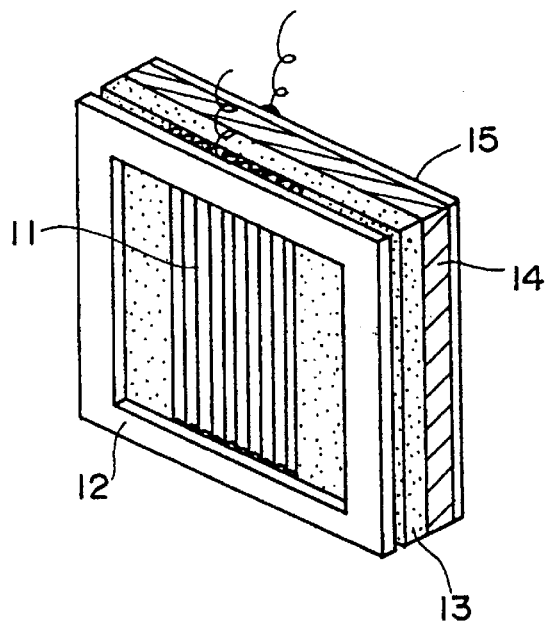
FIG. 1 is a schematic representation showing the structure of a device with the solidified redox reaction system exposed to the atmosphere in the first embodiment.

Reference numbers in the drawings denote: 11 is an anode(corrugated thin plate of platinum), 12 is a jig for holding the anode, 13 is a solidified redox reaction system, 14 is a sulfide semiconductor, 15 is a cathode(thin plate of pure iron), 21 is an anode(thin plate of platinum), 23 is a solidified redox reaction system, 24 is a sulfide semiconductor, 25 is a cathode(thin plate of pure iron), 1 is a circuit with load, 0 is a supplementary circuit, $R_1$ is a resistance of load, $R_0$ is a resistance for adjustment, $E_0$ is a supplementary power source, 31 is an anode(thin plate of graphite), 33 is a liquid state redox reaction system, 34 is a sulfide semiconductor and 35 is a cathode(spider coil-like thin wire immersed in glycerol).

DETAILED DESCRIPTION OF THE PREFERRED EMBODIMENTS

The action in a device of the present invention will be explained hereinbelow. As mentioned before, aqueous solution of $\{Cu^+(NH_3)_2 \sim Cu^{2+}(NH_3)_{2+n}(n=0, 1, 2)\}$ has two roles to perform in the redox reaction system, that is, to generate reaction potential and to transfer electric charge.

Among them, the charge transfer is expected to be performed by the diffusion of cations in the form of $Cu^+(NH_3)_2$ and $Cu^{2+}(NH_3)_{2+n}$ in the aqueous solution. It was thought that the charge transfer ability would be lost in the state where the cations are fixed on the adsorbent and as a result reaction potential generation ability would also be lost, but surprisingly, in the actual system using active carbon as adsorbent, the charge transfer ability increased and reaction potential generation ability was also raised.

To maintain a steady state in the redox reaction system, it is necessary that both concentration of reduced type cations $Cu^+(NH_3)_2$ and oxidized type cations $Cu^{2+}(NH_3)_{2+n}$ are in a steady state.

Oxidation reaction is:

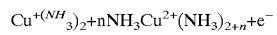

Reduction reaction is:

In the state where either of the reactions proceeds dominantly, there arises inevitably uneven mass distribution of reaction material and the steadiness of reaction will be lost. Here the inventors focused attention on the point that the occurrence of the reaction is influenced by the value of n of an oxidized type cation $Cu^{2+}(NH_3)_{2+n}$, recognized the importance of maintaining high value of n, and investigated thoroughly the condition of realizing it to obtain new findings.

Gibbs energy of formation concerning the complex ion in the aqueous solution is obtained from the table of thermochemical properties as follows:

| | |
|---|---|
| $Cu^+(NH_3)_2$ | $\Delta G^0_{f298} = -65.01$ kJmol$^{-1}$ |
| $Cu^{2+}(NH_3)_2$ | $-30.49$ |
| $Cu^{2+}(NH_3)_3$ | $-73.17$ |
| $Cu^{2+}(NH_3)_4$ | $-111.33$ |

Calculation results of oxidation reaction potential of reaction $Cu^+(NH_3)_2 + nNH_3 \rightarrow Cu^{2+}(NH_3)_{2+n} + e^-$ using above cited values are shown in Table 2.

TABLE 2

| n | $\Delta G_{R-298}$(kJ) | $E^0$(V vs NHE) |
|---|---|---|
| 0 | 33.77 | 0.350 |
| 1 | 17.66 | 0.183 |
| 2 | 6.06 | 0.063 |

It is recognized from this table that, reduction reaction proceeds dominantly over oxidation reaction when n is small and when n=2 the oxidation reaction is easier to keep in balance with the reduction reaction. Therefore, it is necessary to keep n=2 in order to attain a steady state of reaction system. Essentially reaction $Cu^{2+}(NH_3)_{2+n}=Cu^{2+}(NH_3)_2+nNH_3$ is an equilibrating reaction, and if the concentration of $NH_3$ in the vicinity of $Cu^{2+}(NH_3)_{2+n}$ is sufficiently high, the state of n=2 is maintained. On the other hand, when the concentration of $NH_3$ becomes lower than that of equilibrium state, the value of n decreases resulting in uneven distribution of reduced type complex ion $Cu^+(NH_3)_2$.

Oxygen takes on the task of returning unevenly distributed $Cu^+(NH_3)_2$ to $Cu^{2+}(NH_3)_{2+n}$ by oxidation. The reaction is as follows:

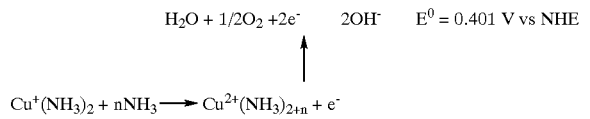

$H_2O + 1/2 O_2 + 2e^- \quad 2OH^- \quad E^0 = 0.401$ V vs NHE $Cu^+(NH_3)_2 + nNH_3 \longrightarrow Cu^{2+}(NH_3)_{2+n} + e^-$ If $OH^-$ formed here is left to remain as it is, it intrudes into the cathode region to corrode the cathode and moreover allows hydroxide to be formed on the electric conduction face of the cathode, which is unfavorable. Therefore, $OH^-$ should be eliminated in the redox reaction system. This is done by the reaction $NH_{4+}+OH^-\rightarrow NH_3+H_2O$. So, it is necessary to allow a sufficient amount of ammonium salt, i.e., ammonium chloride or ammonium sulfate to coexist as reaction material beforehand in the redox reaction system. Advantageously, $NH_3$ formed like this contributes to maintaining high concentration of $NH_3$ in the vicinity of $Cu^{2+}(NH_3)_4$.

As mentioned above, the action of oxygen is important, and the inventors thought up to open the anode room to the atmosphere and to secure a large surface area of the redox reaction system in order to make it easy for the system to receive the action of oxygen.

Thus, the steady maintenance of the concentration of $Cu^{2+}(NH_3)_4$ is made possible in the solidified redox reaction system, in which the aqueous solution of $\{Cu^+(NH_3)_2\sim Cu^{2+}(NH_3)_{2+n}(n=0, 1, 2)\}$ is carried on active carbon and ammonium salts are added. It is supposed that the active carbon acts as catalyst to help the action of oxygen and further as adsorbent to hold $NH_3$.

A thermoelectric power generator provided with the solidified redox reaction system according to the idea and invention described above generates output exceeding that of a thermoelectric power generator provided with a liquid state redox reaction system without the damage of cathode due to corrosion. This will be shown in comparison of the first, second, and third embodiments with the first comparative example.

Although the problem of excessive $OH^-$ can be solved as mentioned above, a remaining problem is that electron demanding action by the reaction of $H_2O+½O_2+2e^-\rightarrow 2OH^-$ promotes electron liberation reaction at the cathode and consumes the cathode due to the action of chemical cell.

Cathode reaction is as follows:

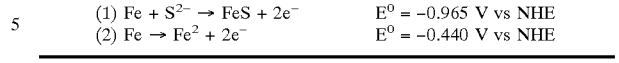

| (1) $Fe + S^{2-} \rightarrow FeS + 2e^-$ | $E^0 = -0.965$ V vs NHE |
| (2) $Fe \rightarrow Fe^{2+} + 2e^-$ | $E^0 = -0.440$ V vs NHE |

Reaction (1) breaks the equilibrium of [FeS ... $S^{2-}$... Fe cathode] which is bearing the role of high electrochemical potential generation and electron conduction, and consumes $S^{2-}$ of finite amount. On the other hand, reaction (2) occurs after reaction (1) proceeds no longer, in which $Fe^{2+}$ formed therein deteriorates the electron conduction ability between FeS and Fe. The electron liberating reaction like this accompanies the existence of the process substantially consuming electrons in a redox reaction system.

Therefore, to allow the reaction of $H_2O+½O_2+2e^-=2OH^-$ to achieve desired action only and not to consume electrons irreversibly has become the next challenge.

The present invention solves the problem through achieving a balance between giving and receiving of electrons in a redox reaction system by adding to the solidified redox reaction system an oxidation electrode which is energized by an auxiliary power source to allow the reaction of $2OH^-\rightarrow H_2O+½O_2+2e^-$ to occur.

This will be explained in reference with an example of the thermoelectric power generator according to the present invention shown in FIG. 3. In the drawing, a thermoelectric power generator is a cell configured so that a solidified redox reaction system (A) and a solidified redox (B) having a direct connection with the solidified redox reaction system (A) on its one side and contacting a sulfide semiconductor on the other side sandwiches an electrode for oxidation, and the face of the sulfide semiconductor not contacting the solidified redox (B) contacts a cathode. A voltage $E_0$ is applied between the electrode for oxidation and the cathode by an auxiliary power source via an adjusting resistance $R_0$ and a supplementary power circuit 0. The output power can be taken out by connecting a load circuit 1 with a load resistance R1 between the cathode and anode.

i) The solidified redox reaction system (A) is given gas permeability to make the transmission of oxygen easy and following reactions are allowed to occur in region (X), (Y), and (Z):

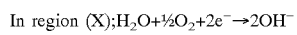

In region (X); $H_2O+½O_2+2e^-\rightarrow 2OH^-$

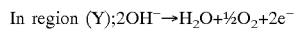

In region (Y); $2OH^-\rightarrow H_2O+½O_2+2e^-$

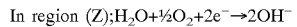

In region (Z); $H_2O+½O_2+2e^-\rightarrow 2OH^-$

↑

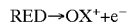

RED→OX$^+$+e$^-$ ii) The solidified redox reaction system (B) is given non-permeability of $O_2$ and resistant property to permeation of $OH^-$, to prevent the transfer of these active reactants.

iii) By providing the direct connection range of the solidified redox reaction systems (A) and (B), the low potential generated in the reaction system (A) is transferred to the reaction system (B) to maintain the potential of the reaction system (B) to a low level, by which the concentration of reduced type complex ion and that of oxidized type complex ion are maintained in an appropriate relation.

iv) The electrons liberated at the cathode flows into the redox reaction system (B) as diode current. The electrons have high potential and have the possibility of exerting the destructively reductive action to the redox reaction system as follows:

$$Cu^+(NH_3)_2 + e^- \rightarrow Cu + 2NH_3(Aq) \quad E^0 = -0.12V \text{ vs NHE}$$

Therefore, it is required to use in the reaction system (B) a complex ion species which is resistive to destruction. Here, the inventors paid attention to $Ni^{2+}(NH_3)_6$. The destructive reduction reaction of this complex ion is well known.

$$Ni^{2+}(NH_3)_6 + 2e^- \rightarrow Ni + 6NH_3(Aq) \quad E^0 = -0.49V \text{ vs NHE}$$

This complex ion is much more resistant to destruction than $Cu^+(NH_3)_2$. However, whether $Ni^{2+}(NH_3)_6$ exhibits redox reaction behavior or not could not be found in literatures.

$[Ni(CN)_4]^{3-} \sim [Ni(CN)_4]^{2-}$ is known in a redox reaction system which Ni ion forms, and this is the change of $Ni^+ \leftrightarrows Ni^{2+} + e^-$.

On the assumption that a complex ion group with $NH_3$ also exhibits redox reaction behavior, the inventors assumed as:

$$Ni^+(NH_3)_6 \rightarrow Ni^{2+}(NH_3)_6 + e^- \quad E^0 = -0.2V \text{ vs NHE}$$

v) The following reaction is known as redox reaction which does not suffer destructive reduction:

$$[Fe(CN)_6]^{3-} + e^- \rightarrow [Fe(CN)_6]^{4-} \quad E^0 = -0.36 \text{ V vs NHE}$$

The destructive reduction reaction of this complex ion species is $$[Fe(CN)_6]^{4-} + 2e^- \rightarrow Fe + 6CN^- \quad E^0 = -1.8V \text{ vs NHE}$$

and this reaction does not occur by the electrons liberated at Fe cathode. Therefore, the reaction system can be said to be superior concerning the two points mentioned above. However, $[Fe(CN)_6]^{3-}$ generates nascent oxygen when meeting with an alkali by the following reaction and adversely affects against the sulfide semiconductor and Fe cathode.

$$2[Fe(CN)_6]^{3-} + 2OH^- \rightarrow 2[Fe(CN)_6]^{4-} + H_2O + O$$

vi) In view of the circumstances mentioned heretofore, the inventors obtained a finding that it is suitable to make the redox reaction system (B) non-permeable to gas and $OH^-$ by using $Ni^{2+}(NH_3)_6$ as complex ion and filling fine pores in the layer with a binder consisting of organic polymer when solidifying the system to be mounted on the thermoelectric power generator. Thus, the invention as shown in FIG. 3 was completed. A concrete example will be described later as embodiment example 2.

Figure 2:
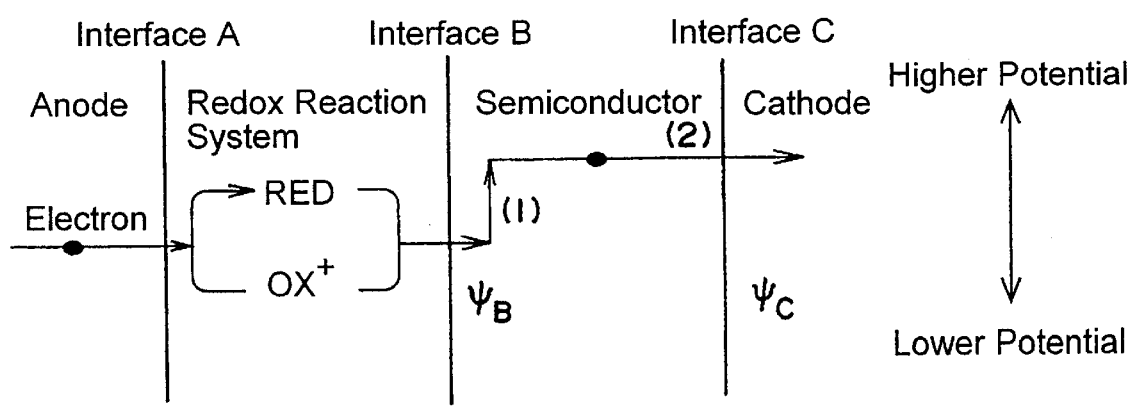
FIG. 2 is a conceptual rendering for explaining the transfer of electrons and the change of potential in a device according to the present invention.

Next, the inventors investigated concerning what the peculiar action of active carbon arises from and obtained further findings. The thermoelectric conversion according to the present invention is possible by the interlocking of adjoining redox reaction system and semiconductor as shown in FIG. 2. In FIG. 2, symbols denoted as follows:

RED reduced type complex ion
OX⁺ oxidized type complex ion
(1) thermal excitation between energy bands
(2) electron separation
ψB redox reaction potential
ψC cathode reaction potential The redox reaction system bears the role of electric conduction and generation of low electrochemical potential, the semiconductor bears the role of thermal excitation between energy bands and succeeding separation of carriers.

Factors regulating the flow rate of electron from interface (A) to interface (C) are thought to be reaction rate in the redox reaction system, and thermal excitation rate of electron from valance band to conduction band, and diode current in the semiconductor. The inventors ascertained that the rate determining step through the processes was redox reaction, and active carbon contributed in one hand as the adsorbent of redox reaction material and the other hand as the electron conduction path. Actually the resistance of powdered active carbon made of Kantoh Chemicals Ltd. and used in this experiments was measured as 0.8 kΩ by a tester at the submerged probes distance of 1 cm. This relation is shown in the fourth embodiment example and the third comparison example.

In the case the role of reaction potential generation and the role of electron transfer are divided as in the present invention, since the adsorbent of redox reaction liquid need not have electron transfer ability, any of general-purpose adsorbent such as active carbon, charcoal, silica gel, molecular sieve, and hemihydrated gypsum may be adopted, and further soccer ball-like carbon which is new material can be used as well. It is permissible to select among them a material having the strongest adsorbing ability for the complex ions composing the redox system. Here, the adsorbing ability means adsorption density and fixing strength.

As material for bearing the role of electron conduction, platinum, gold, graphite, etc. having high electrochemical stability are suitable. The material should be allowed to coexist in the redox reaction system in the form of flocculus, net, or chip. Aside from this, $Cu_2S$ which is a p-type semiconductor may be used as conductive material.

The inventors investigated concerning the method for reducing the adverse effect of diode current. The diode current should be minimized as mentioned before since it induces the destructive reduction of the redox reaction system. On the other hand, it is well known in a crystal semiconductor that the diode current is reduced by pn junction.

Based on this fact mentioned above, the inventors made an aniso type hetero junction of p-type $Cu_2S$ in a state of solidified fine particles with n-type FeS, and attained the desired result.

Figure 3:
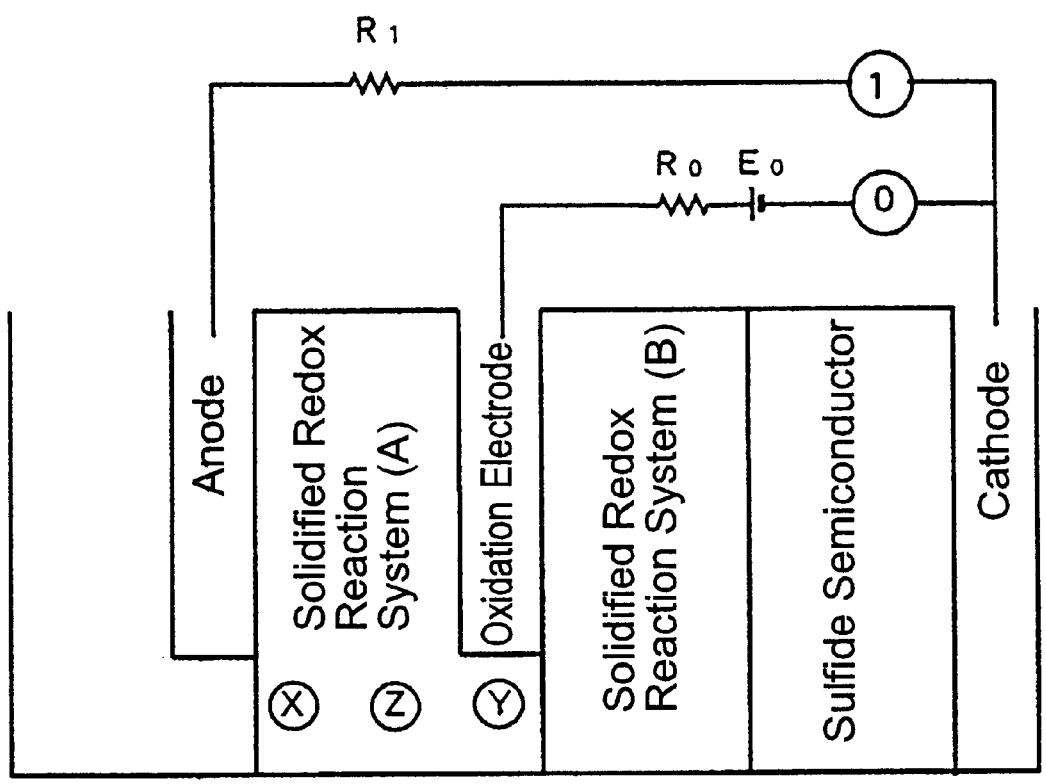
FIG. 3 is a schematic representation showing the configuration of the device in the second embodiment.

Specifically, $Cu_2S$ is provided instead of the solidified redox reaction system (B) in the thermoelectric power generator configured as shown in FIG. 3. In this case, it is necessary to produce the state having non-permeability of gas and $OH^-$ by adding a binder consisting of organic polymer the same as in the solidified redox reaction system (B).

The result of power generation by the thermoelectric power generator of this type is shown in the third example.

The inventors also takes note of the fact that there are two significant meanings in removing the aqueous solution of electrolyte from the cathode region.

In a thermoelectric power generator configured in the following form:

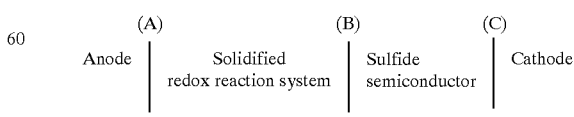

The necessary conduction is to relate the lower electrochemical potential at interface (B) with higher electrochemical potential at interface (C) via the salt bridge in the semiconductor. Simultaneous progress of redox reaction and cathode reaction results in a chemical battery and damages the durability of power output. Therefore, the simultaneous progress should be forbidden.

It is useful for suppressing the re-elution of aqueous solution from the solidified redox reaction system as mentioned before and also for suppressing the progress of chemical battery action as mentioned above not to provide the room of the aqueous solution of electrolyte in the cathode region. However, if the cathode contact is entirely dry, reaction potential is not generated. By impregnating glycerol or glycerol with water in region (C) instead of the aqueous solution of electrolyte, continuous power generation has become possible.

The basic conditions for realizing thermoelectric power generation conceived and invented by the inventors will be wholly summarized hereinbelow.

The first condition is to allow the electrons thermally excited from valence band to conduction band in a semiconductor to gather on region of cathode contact, and to allow holes to gather on region of anode contact. This condition can be realized by allowing the semiconductor to contain an appropriate electrostatic field in it.

The second condition is to allow the carriers collected on respective region to have the density or potential energy or both larger than that of thermal equilibrium state. By this excess, the Fermi level of region (C) can be raised higher than that of region (A).

The first means for realizing the excess is the method in which the density of minority carriers in either plane of the semiconductor is increased beyond that of thermal equilibrium state by the electrochemical reaction existing in the plane.

The second means is the method in which electrochemical reaction of low Fermi level is allowed to exist in the anode side, on the other hand that of high Fermi level is allowed to exist in the cathode side, and the potential difference between both reactions is applied upon the semiconductor as minus bias voltage. As to the power output, the second means is overwhelmingly superior.

The third condition is to select a large area sheet-like semiconductor which is suitable for realizing the first and second condition and also suitable for mass production of the thermoelectric power generator. This can be realized by forming and hardening wet, fine particles of sulfide semiconductor by use of appropriate binder and supporting materials.

The fourth condition is to prevent the corrosion of cathode induced by the intrusion of reactive matter into the cathode range by allowing suitable adsorbent such as active carbon to solidify the aqueous solution of the redox reaction system used as the generating source of the lower Fermi level for the anode side.

The fifth condition is not to allow the chemical battery reaction to proceed between the electrochemical reaction at anode side and that at cathode side in the thermoelectric power generator formed by the second means of the second condition. It is important not to allow substantial absorption of electrons to occur in the redox reaction system, since, if the substantial absorption of electrons occurs in the redox reaction system, it induces the electron liberating cathode reaction and allows the chemical battery reaction to proceed. The auxiliary oxidation electrode provided in the redox reaction system works to achieve this. Further, it is also important that in the salt bridged range between anode and cathode, substantial transfer of ions is suppressed.

Thermoelectric power generation is possible when the first and second condition among the five conditions are established at the same time. However, the attainment of practicability requires the establishment of all conditions from the first to the fifth at the same time.

By the way, the inventors cited in the first application, Japanese Unexamined Patent Publication 6-151978, mainly about the first condition and the means for realizing the condition, and concerning the second condition, the first means is mentioned only slightly.

The first condition and the means for realizing the condition are publicly known, however, the idea of utilizing them for a thermoelectric power generator was a fresh one at the time and it is thought to be meaningful that examples of devices realizing the second condition are disclosed in the application.

The present invention opens the way to practical use of a thermoelectric power generator by cultivating a better understanding on the essence of action in the second condition and adding the forth and fifth conditions.

THE FIRST EXAMPLE

The solidified redox reaction system 13 was formed by allowing the saturated aqueous solution of $\{Cu^+(NH_3)_2 \sim Cu^{2+}(NH_3)_{2+n}(n=0, 1, 2)\}$ to be adsorbed to a proper amount of active carbon powder to be made into a state of coagulated powder without free liquid phase, adding a small amount of hemihydrated gypsum, a proper amount of crystal grains of ammonium chloride, and glycerol added with water to reduce the coagulated powder to a slurry to be poured into a determined mold and hardened.

FeS 14 was formed by adding $S^{2-}$ in the form of aqueous solution of 15 wt % of $K_2S$ to a determined amount of crystal grains of $FeSO_4 \cdot 7H_2O$ so that the equivalence ratio of $S^{2-}/Fe^{2+}$ was 0.90 to cause reaction. A small amount of $ZnCl_2$ powder was added to the obtained colloidal reaction product to fix the remaining free $S^{2-}$ as ZnS.

The preparation of these sulfides was done in an atmosphere without air.

A proper amount of hemihydrated gypsum was added as hardening agent to the reaction product to reduce it to slurry. The slurry was carried on water retaining papers of determined size, then determined numbers of sheets of the papers were overlapped, pressed, and hardened.

The electric conduction type of the FeS prepared by this method was determined as n-type from the measurement of Seebeck effect. A small amount of glycerol was allowed to permeate in the cathode range of FeS. The action area of the FeS layer provided on the device was consistently 4 cm².

The cathode 15 was a thin plate of pure iron contacting with FeS 14 prepared by the method mentioned above in accordance with the determined arrangement as shown in FIG. 1 showing the construction of the device. Then, the solidified redox reaction system 13 was brought into contact with FeS 14, and the anode 11 of corrugated platinum thin plate was brought into contact with the redox system 13 using the anode holding jig 12 so that part of the solidified redox system 13 was exposed to the atmosphere. Then they were tightened together from outside to complete the assemblage of the device.

The power generation performance (at an operating temperature of 40~45° C.) of a device thus prepared is shown in Table 3, and slight cathode corrosion was observed.

TABLE 3

| | Open circuit voltage 0.83~0.86 V | |
|---|---|---|
| Load resistance($\Omega$) | Output(mW) | Power output after continuous generation for 5 Hrs. |
| 330 | 1.5 | No attenuation |
| 170 | 2.7 | No attenuation |
| 45 | 3.9 | Slight attenuation |

THE SECOND EXAMPLE

The solidified redox reaction system 13 was formed according to FIG. 3 by coupling reaction system (A) of $\{Cu^+(NH_3)_2 \sim Cu^{2+}(NH_3)_4\}$ and reaction system (B) of $Ni^{2+}(NH_3)_6$. At first, reaction system (B) was prepared by adding a determined amount of active carbon powder to the aqueous solution of $Ni^{2+}(NH_3)_6$ and mixing sufficiently, then adding a determined amount of hemihydrated gypsum and water and mixing sufficiently.

Then, after adding an adhesive substance for wood working and mixing sufficiently, the obtained slurry-like mixture was poured into a determined mold and hardened. An adhesive substance for wood working or the like was filled in the gap developed between the mold and the mixture due to the shrinkage of the hardened mixture. After completion of this process, the supplementary platinum electrode for oxidation was installed and the frame for reaction system (A) was fitted.

Then, a determined amount of ammonium chloride was added to the saturated aqueous solution of $\{Cu^+(NH_3)_2 \sim Cu^{2+}(NH_3)_4\}$, a proper amount of active carbon powder was added and mixed sufficiently, after that a determined amount of hemihydrated gypsum and water was added and mixed sufficiently to reduce the mixture to a slurry state. The slurry was poured into a mold prepared beforehand and hardened.

Here the area of the supplementary platinum electrode should be smaller than that of the electric conduction plane of the redox reaction system to secure the direct connection region of reaction system (A) with reaction system (B).

Next, FeS 14 was formed by adding $S^{2-}$ in the form of aqueous solution of 15 wt % of $K_2S$ to a determined amount of crystal grains of $FeSO_4 \cdot 7H_2O$ so that the equivalence ratio of $S^{2-}/Fe^{2+}$ is 0.90 to cause reaction, and adding a small amount of $ZnCl_2$ powder to the colloidal reaction product obtained to react with the remaining $S^{2-}$. The preparation of these sulfides was done in an atmosphere without air.

Then, after a determined amount of hemihydrated gypsum was added and mixed sufficiently, the reaction product was carried on water retaining papers of determined size wetted with ethanol anhydride, required numbers of sheets of the papers were overlapped, pressed, and hardened.

The cathode 15 made of a thin plate of pure iron and the anode 11 made of a corrugated thin plate of platinum were used, the redox reaction system 13 respectively by using the anode holding jig 12 such that part of the redox reaction system 13 was exposed to the atmosphere, and the assemblage of the device was completed by tightening them from outside.

The power generation performance at an operating temperature of 37~41° C. of the device thus prepared is shown in Table 4. No cathode corrosion was observed.

TABLE 4

| Open circuit voltage (V) | 0.72~0.75 |
|---|---|
| Current (mA); Load resistance: 85$\Omega$ | 5.3 |
| Power (mW); Load resistance: 85$\Omega$ | 2.4 |
| Quantity of electricity(Coulomb) | 490 |
| Supplementary current (mA) | 0.25 |
| Power output after continuous generation for 25 Hrs. | No attenuation |

THE THIRD EXAMPLE

Figure 4:
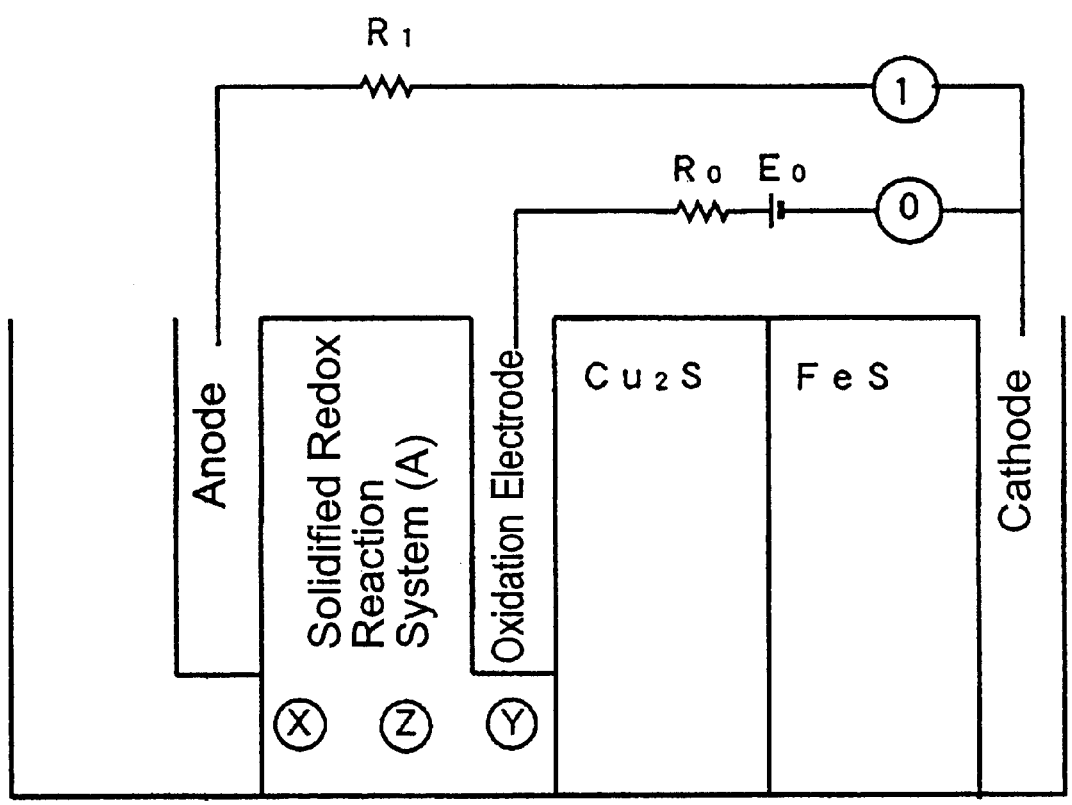
FIG. 4 is a schematic representation showing the configuration of the device in the third embodiment.

The thermoelectric power generator was composed as shown in FIG. 4.

At first, $Cu_2S$ layer was formed. $S^{2-}$ in the form of aqueous solution of 15 wt % of $K_2S$ was added to a determined amount of CuCl powder for reaction so that the equivalence ratio of $S^{2-}/2Cu^+$ was 1.0, filter paper was pushed against the reaction product to dehydrate. The preparation of these sulfides was done in an atmosphere without air or preferably in inert-gas atmosphere.

A determined amount of hemihydrated gypsum was added to the obtained cake and mixed, further a determined amount of an adhesive substance for wood working was added and mixed sufficiently. The obtained viscous liquid was filled in a determined mold and hardened. As the hardened substance shrank in the mold to develop a gap between them, an adhesive substance for wood working was filled in the gap.

The supplementary platinum electrode for oxidation was installed to the $Cu_2S$ layer and the frame for the redox reaction system 13 was fitted. Here the area of the supplementary platinum electrode should be smaller than that of the electric conduction plane of the $Cu_2S$ layer to secure the direct connection region of the redox reaction system with $Cu_2S$.

The redox reaction system 13 of $\{Cu^+(NH_3)_2 \sim Cu^{2+}(NH_3)_4\}$ was formed by the same process as in the second example.

FeS 14 was formed also by the same process as in the second example. The cathode 15 was installed, the anode 11 was attached by the medium of the holding jig 12 so that part of the redox reaction system 13 was exposed to the atmosphere, and finally they were tightened from outward to complete assemblage.

The power generation performance (at an operating temperature of 37~41° C.) of the device thus prepared is shown in Table 5. No cathode corrosion was observed.

TABLE 5

| Open circuit voltage (V) | 0.78~0.80 |
|---|---|
| Current (mA); Load resistance: 45$\Omega$ | 9.2 |
| Power (mW); Load resistance: 45$\Omega$ | 3.9 |
| Quantity of electricity(Coulomb) | 460 |
| Supplementary current (mA) | 0.33 |
| Power output after continuous generation for 15 Hrs. | No attenuation |

THE FOURTH EXAMPLE

The solidified redox reaction system 23 was formed by allowing the concentrated aqueous solution of $Ni^{2+}(NH_3)_6$ to be adsorbed to a proper amount of charcoal powder to be made into a state of coagulated powder without free liquid phase, adding and mixing a large amount of graphite chips (about 3mm×3mm×0.38mmt), and filling the mixture in a determined mold.

FeS 24 was formed as in the first example.

A thin plate of pure iron and a thin corrugated plate of platinum was used as the cathode 25 and anode 21 respectively. Each component was arranged and brought into contact with other element in accordance with FIG. 1 showing the construction of the device and tightened from outward to complete the assemblage of the device.

The power generation performance (at an operating temperature of 40~45° C.) of the device thus prepared is shown in Table 6.

TABLE 6

| Open circuit voltage 0.47~0.50 V | | |
|---|---|---|
| Load resistance($\Omega$) | Output (mW) | Power output after continuous generation for 2 Hrs. |
| 25 | 0.60 | Slight attenuation |

THE FIRST COMPARATIVE EXAMPLE

The saturated aqueous solution of $\{Cu^+(NH_3)_2\text{-}Cu^{2+}(NH_3)_{2+n}(n=0, 1, 2)\}$ was used as the redox reaction system 33. It was poured into the liquid room of the liquid phase redox reaction system of the device configured as shown in FIG. 4 with its upper part open to the atmosphere.

FeS 34 was formed by adding $S^{2-}$ in the form of aqueous solution of 15 wt % of $K_2S$ to a determined amount of crystal grains of $FeSO_4 \cdot 7H_2O$ so that the equivalence ratio of $S^{2-}/Fe^{2+}$ is 0.90 to cause reaction. A small amount of $ZnCl_2$ powder was added to the obtained colloidal reaction product to fix the remaining free $S^{2-}$ as ZnS. The preparation of these sulfides was done in an atmosphere without air or preferably in inert-gas atmosphere. An adhesive substance for wood working of 1.2 times in volume was added to the obtained reaction product and mixed. The obtained viscous slurry was carried on water retaining paper of determined size, required numbers of sheets of the paper were overlapped, pressed, and hardened. The hardened solid body was installed in a chamber made of rubber plate, and the periphery of the solid body was glued to the chamber with an adhesive substance for wood working so that no gaps were remained. The reason an adhesive substance for wood working was used is to prevent the permeation of reaction liquid by filling vacant spaces and to allow the FeS layer to be moist to the minimum extent required.

Figure 5:
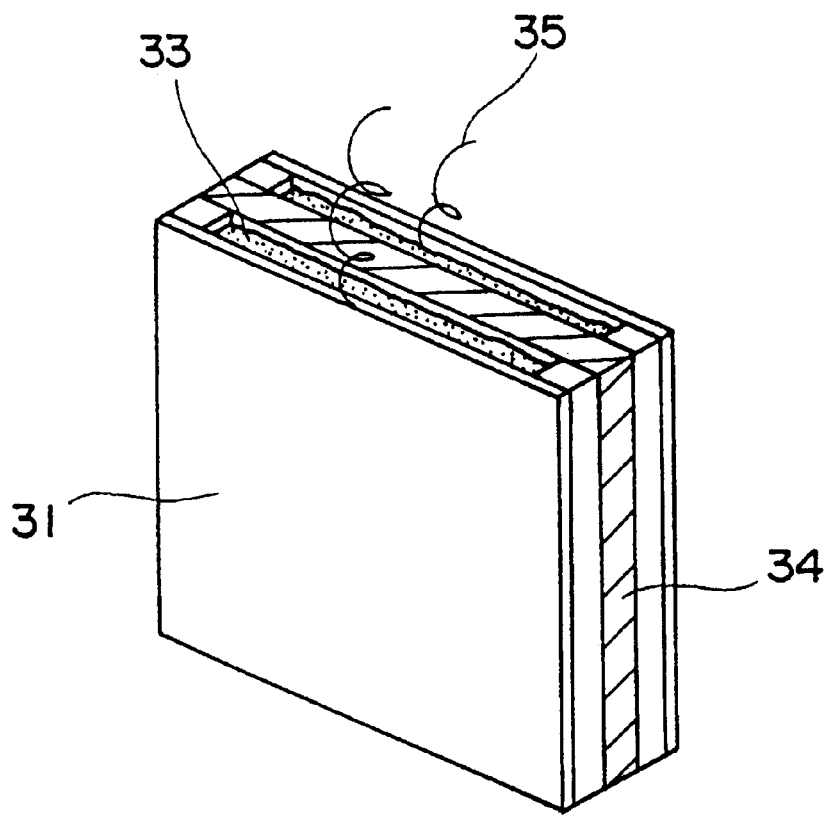
FIG. 5 is a schematic representation showing the construction of a device of the first comparative example in which the redox reaction system is liquid phase and cathodes are spider coils immersed in glycerol.
Figure 5:
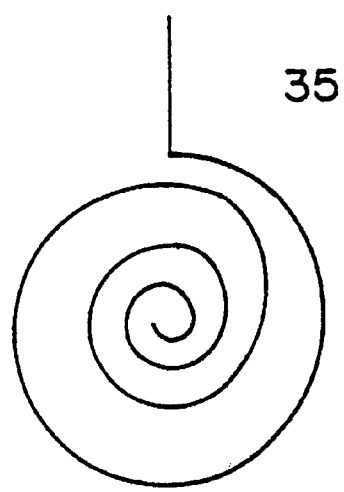

A thin wire of iron wound in a spiral coil was used as cathode 35 which was immersed in glycerol in the cathode room of the device constructed as shown in FIG. 5. By this the redox reaction liquid is difficult to transfer to the cathode room.

A thin plate of graphite was used as anode 31, and the device was assembled by the same method as in the first example as shown in FIG. 5.

The power generation performance (at an operating temperature of 40~42° C.) of the device is shown in Table 7. Corrosion of the cathode occurred considerably when the generated quantity of electricity was 750 coulombs. However, the amount of corrosion was small compared with that estimated in correspondence with the generated quantity of electricity.

TABLE 7

| Open circuit voltage 0.63 V | | |
|---|---|---|
| Load resistance($\Omega$) | Output (mW) | Power output after continuous generation for 5 Hrs. |
| 68 | 1.7 | Almost no attenuation |
| 50 | 1.7 | Slight attenuation |

THE SECOND COMPARATIVE EXAMPLE

Figure 6:
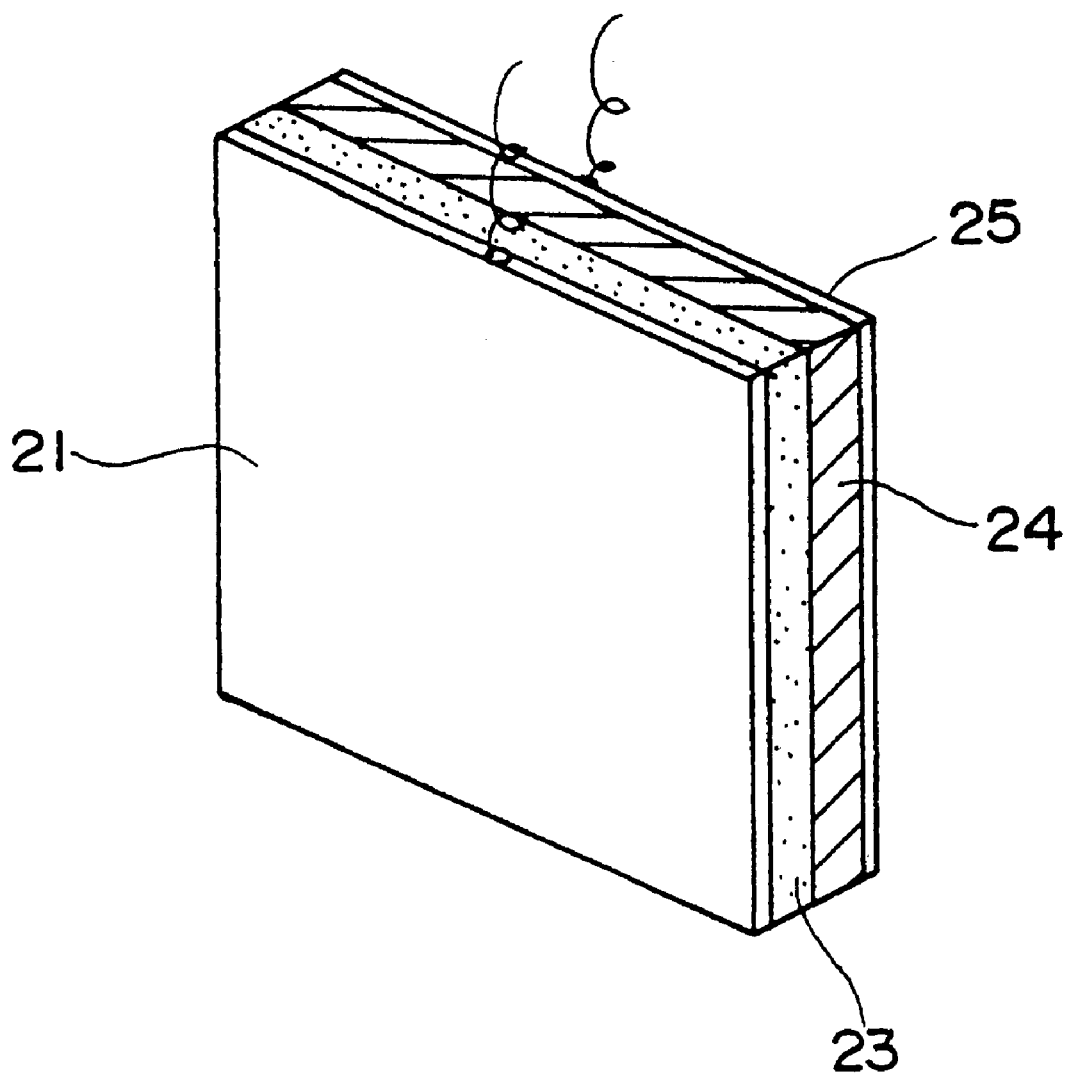
FIG. 6 is a schematic representation showing the structure of a device of the second and third comparative examples with the solidified redox reaction system isolated from the atmosphere.

This differs from the first example in that the solidified redox reaction system was shut off from the atmosphere. Otherwise, the conditions were the same as in the first example. The construction of the device is shown in FIG. 6. The power generation performance (at an operating temperature of 40~45° C.) of the device is shown in Table 8.

TABLE 8

| Open circuit voltage 0.83 V | | |
|---|---|---|
| Load resistance($\Omega$) | Output (mW) | Power output after continuous generation for 5 Hrs. |
| 330 | 1.4 | Considerable attenuation |

THE THIRD COMPARATIVE EXAMPLE

A concentrated aqueous solution of $Ni^{2+}(NH_3)_6$ was used as original liquid for the solidified redox reaction system 23. The solution was adsorbed to a proper amount of charcoal powder to reduce the solution to a state of coagulated powder without free liquid phase. Then a proper amount of hemihydrated gypsum and water was added to reduce the coagulated powder to slurry. The slurry was poured into a determined mold and hardened. FeS 24 was formed by the same method as in the first example.

A thin plate of pure iron and a thin plate of platinum were used as cathode 25 and anode 21 respectively. Each constituent element was arranged and contacted as shown in FIG. 6, and tightened from outside to complete the assemblage of the device. The power generation performance (at an operating temperature of 44~47° C.) of the device thus prepared is shown in Table 9.

TABLE 9

| Open circuit voltage 0.74 V | | |
|---|---|---|
| Load resistance($\Omega$) | Output (mW) | Power output after continuous generation for 2 Hrs. |
| 25 | 0.02 | No attenuation |

INDUSTRIAL APPLICABILITY

As cited above, according to the present invention, the conversion of thermal energy to electric power is possible with high thermal efficiency.

The thermoelectric power generator according to the present invention uses the Fermi level of electrochemical reaction as source of function and is of compact construction with less wear and easy maintenance.

Moreover, semiconductors suitable for mass production are used, which is beneficial for the general purpose use of the thermoelectric power generator of the present invention.

What is claimed is:

1. A thermoelectric power generator comprising a thin plate of solidified fine and hydrated particles of a sulfide semiconductor in contact with an electrochemical reaction having a lower Fermi level on a side and in contact with an electrochemical reaction having a higher Fermi level on an opposite side, wherein the electrochemical reaction having the lower Fermi level is a first solidified redox reaction system comprising an aqueous solution of $\{Cu^+(NH_3)_2 \sim Cu^{2+}(NH_3)_{2+n}(n=0, 1, 2)\}$ or $Ni^{2+}(NH_3)_6$ carried on electrically conductive adsorbent and bound with hydrophilic organic polymer and hemihydrated gypsum.

2. A thermoelectric power generator according to claim 1, wherein the sulfide semiconductor plate consists of a single n-type or single p-type sulfide semiconductor.

3. A thermoelectric power generator according to claim 1, wherein the sulfide semiconductor plate comprises an aniso type hetero junction between a p-type sulfide semiconductor located in the anode side and a n-type sulfide semiconductor located in the cathode side.

4. A thermoelectric power generator according to claim 1, wherein the first solidified redox reaction system is composed so that rate controlling steps of an electron transfer are a reaction at an interface between the first solidified redox reaction system and the sulfide semiconductor plate, and conduction through the conductive adsorbent.

5. A thermoelectric power generator according to claim 4, wherein the adsorbent of the first solidified redox reaction system comprises an adsorptive constituent and an electron conducting and chemically stable constituent.

6. A thermoelectric power generator according to claim 5, wherein the adsorptive constituent is selected from the group consisting of active carbon, charcoal, silica gel, hemihydrated gypsum, molecular sieve, and soccer ball-like carbone, and the electron conductive constituent is selected from the group consisting of platinum, gold, and graphite.

7. A thermoelectric power generator according to claim 1, further comprising:

a second solidified redox reaction system, having a direct connection on a side with the first solidified redox reaction system;

an anode in contact with the second solidified redox reaction system; and an auxiliary electrode sandwiched between and in contact with the first and second solidified redox reaction systems, wherein a reaction $H_2O+\frac{1}{2}O_2+2e^- \leftrightarrows 2OH^-$, being effective to sustain the lower Fermi level of the redox reaction, is kept in the state of dynamic balance by cooperation of the anode and the auxiliary electrode for oxidation.

8. A thermoelectric power generator according to claim 1, further comprising a cathode in contact with the sulfide semiconductor plate, wherein the cathode is composed of a metal selected from the group consisting of Fe, Ni, Cu, and brass, and wherein the sulfide semiconductor plate further comprises at least an effective amount of water or glycerol in order to generate a high Fermi level in the equilibrium reaction.

9. A thermoelectric power generator according to claim 1, wherein the hydrated fine particles of sulfide semiconductor are selected from the group consisting of $Cu_2S$, $FeS$, $Fe_2S_3$, $NiS$, coprecipitated $FeS \cdot NiS$ and coprecipitated $FeS \cdot ZnS$, wherein said particles are synthesized by an ionic reaction between a constituent cation in the form of chloride or sulfate and $S^{2-}$ in the form of aqueous solution of 10~20 wt % of potassium sulfide or sodium sulfide at an equivalence ratio of $S^{2-}$ to cation between 0.85 to 1.1, and wherein the ionic reaction produces a colloidal slurry of sulfide semiconductor particles.

10. A thermoelectric power generator according to claim 9, wherein the colloidal slurry of sulfide semiconductor particles synthesized by ionic reaction in aqueous solution is solidified into a thin plate by adding binders to the aqueous solution, supporting the solution on a plurality of sheets of liquid absorbing paper, layering the plurality of the sheets, and drying the plurality of sheets.

11. A thermoelectric power generator according to claim 10, wherein the binders are selected from the group consisting of hemihydrated gypsum and hydrophilic organic polymer.

* * * * *